(12) United States Patent
Kam et al.

(10) Patent No.: US 7,339,364 B2
(45) Date of Patent: Mar. 4, 2008

(54) CIRCUIT AND METHOD FOR ON-CHIP JITTER MEASUREMENT

(75) Inventors: Brandon R. Kam, Waipalu, HI (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/424,881

(22) Filed: Jun. 19, 2006

(65) Prior Publication Data
US 2008/0012549 A1   Jan. 17, 2008

(51) Int. Cl.
G01R 23/175 (2006.01)
H03L 7/06 (2006.01)

(52) U.S. Cl. ............... 324/76.54; 324/76.11; 324/765; 327/158

(58) Field of Classification Search ............. 324/76.54, 324/76.11, 765; 327/158
See application file for complete search history.

(56) References Cited

U.S. PATENT DOCUMENTS

| | | | |
|---|---|---|---|
| 5,103,466 A | 4/1992 | Bazes | |
| 5,661,419 A | 8/1997 | Bhagwan | |
| 5,663,991 A | 9/1997 | Kelkar et al. | |
| 5,793,822 A | 8/1998 | Anderson et al. | |
| 5,889,435 A | 3/1999 | Smith et al. | |
| 6,295,315 B1 | 9/2001 | Frisch et al. | |
| 6,396,889 B1 | 5/2002 | Sunter et al. | |
| 6,661,266 B1 | 12/2003 | Variyam et al. | |
| 6,795,496 B1 | 9/2004 | Soma et al. | |
| 6,815,990 B2 | 11/2004 | Lee | |
| 6,841,985 B1 | 1/2005 | Fetzer | |
| 6,850,051 B2 | 2/2005 | Roberts et al. | |
| 6,853,231 B2 * | 2/2005 | Millar | 327/236 |
| 2003/0200407 A1 * | 10/2003 | Osaka et al. | 711/167 |
| 2003/0223526 A1 | 12/2003 | Sorna | |
| 2004/0128591 A1 | 7/2004 | Ihs et al. | |
| 2005/0057312 A1 | 3/2005 | Chang et al. | |
| 2005/0253617 A1 * | 11/2005 | Roberts et al. | 324/765 |

FOREIGN PATENT DOCUMENTS

EP   0 889 441 A2   1/1999
WO   WO 98/44672   10/1998

* cited by examiner

*Primary Examiner*—Vincent Q. Nguyen
(74) *Attorney, Agent, or Firm*—Gibb & Rahman, LLC; Michael LeStrange, Esq.

(57) ABSTRACT

An improved built-in self-test (BIST) circuit and an associated method for measuring phase and/or cycle-to-cycle jitter of a clock signal, the BIST circuit implement a Variable Vernier Digital Delay Locked Line method. Specifically, the embodiments of the BIST circuit incorporate both a digital delay locked loop and a Vernier delay line, for respectively coarse tuning and fine tuning portions of the circuit. Additionally, the BIST circuit is variable, as the resolution of the circuit changes from chip to chip, and digital, as it is implemented with standard digital logic elements.

10 Claims, 11 Drawing Sheets

CIRCUIT AND METHOD FOR ON-CHIP JITTER MEASUREMENT

BACKGROUND

1. Field of the Invention

The embodiments of the invention generally relate to jitter measurement, and, more particularly, to a built-in self-test (BIST) circuit for measuring phase and/or cycle-to-cycle jitter of a clock signal.

2. Description of the Related Art

Phase locked loops (commonly referred to as PLLs) are found in a large number of computer, wireless, and communication systems with many different applications such as clock recovery, frequency synthesis and clock noise filtration. In the last several decades, a rapid increase in the speeds of digital circuitry have put strenuous demands upon PLL designers. One result of the fast increase in performance is that harmful noise parameters are becoming a relatively larger design problem. One such parameter, jitter, has quickly become one of the most critical parameters in specifying the operation of a PLL. As a result, extremely accurate analysis of PLL jitter characteristics is becoming required during production testing to ensure the PLL performs within its design specifications. With clock signals getting faster each year, the ability to measure jitter in the realm of picoseconds (ps) is becoming essential. However, in high volume production of PLLs there are very few mechanisms implemented to monitor jitter. Thus, PLLs could be shipped to clients who assume the circuit is within jitter specifications, when actually no concrete information has been developed to either prove or disprove the fact.

As a result, designers have recently been looking towards built-in self-test (BIST) solutions. In a high volume production setting, BIST solutions can offer a low-cost, accurate, and fast solution in determining jitter. Thus, disclosed herein are embodiments of a BIST circuit that can determine PLL jitter with high accuracy over a wide input frequency range.

SUMMARY

In view of the foregoing, disclosed herein are embodiments of an improved BIST circuit and an associated method of measuring phase and/or cycle-to-cycle jitter of a clock signal. The embodiments of the BIST circuit implement a Variable Vernier Digital Delay Locked Line method. Specifically, the embodiments of the BIST circuit of the invention incorporate both a digital delay locked loop and a Vernier delay line, for coarse tuning and fine tuning portions of the BIST circuit, respectively. Additionally, the BIST circuit is variable, as the resolution of the circuit changes from chip to chip, and digital, as it is implemented with standard digital logic elements.

More particularly, disclosed herein are embodiments of a BIST circuit to measure clock signal jitter. The circuit can comprise a clock signal generator, a delay locked loop, a Vernier delay line, a plurality of multiplexers, a controller and a processor.

The clock signal generator can, for example, comprise a phase locked loop that is configured to output a clock signal. The phase locked loop can comprise a phase detector/comparator, a loop filter, a voltage-controlled oscillator (VCO), and an optional frequency divider. Specifically, the PLL can be configured to use negative feedback based on sensing the phase difference, via the phase detector, of the input frequency from a reference source (i.e., reference frequency) and either the direct output frequency (i.e., an output clock signal) from the VCO or the output frequency (i.e., a feedback clock signal) from the optional frequency divider, which divides the frequency of the directed output signal of the VCO by a predetermined amount (e.g., one-half).

The delay locked loop (DLL) is electrically connected to the generator and is adapted to function as a coarse tune mode for jitter calculation. Specifically, the DLL can be configured to delay the clock signal, to lock the clock signal when a predetermined phase shift is achieved, and, once locked, to output the clock signal as a delayed clock signal. This DLL can comprise a single delay chain (i.e., a first delay chain), a phase detector and a counter. The delay chain can propagate the clock signal from the clock signal generator (e.g., the clock signal output of a PLL) through a plurality of delay elements (i.e., first delay elements) that are connected in series and are configured to delay the clock signal until the predetermined phase shift is achieved. The phase detector can be electrically connected to the first delay chain and can be configured to determine if additional delay is required to achieve the predetermined phase shift. The counter can be electrically connected to both the phase detector and the first delay chain and can be configured to incrementally add delay to the first delay chain if additional delays are required. Once the predetermined phase shift is achieved, the clock signal is locked in, and the delayed clock is output to the Vernier delay line.

The Vernier delay line (VDL) is electrically connected to both the clock signal generator and the DLL and is adapted to function as a fine tune mode for jitter calculation. Specifically, the VDL can comprise two parallel delay chains each comprising corresponding delay elements (i.e., a second delay chain comprising a plurality of second delay elements connected in series and a third delay chain comprising a plurality of third delay elements connected in series). These two delay chains can be configured to simultaneously propagate and delay different clock signals. The VDL can further be configured to acquire data from these delay chains that indicates the phase differences between those clock signals as they are propagated and to also store that data (e.g., in logic circuits or counters). This data can be accessed by the processor and analyzed to measure jitter (e.g., phase jitter or cycle-to-cycle jitter, depending upon the clock signals propagated).

More particularly, the circuit can also comprise a first multiplexer, a second multiplexer and a controller. The first multiplexer can be configured to selectively connect the DLL and the VDL to one of a reference clock signal, the feedback clock signal from the PLL (i.e., the output frequency of the PLL frequency divider) or the initial clock signal from the PLL (i.e., the output frequency of the PLL VCO). The second multiplexer can be configured to selectively connect the VDL to one of the reference clock signal, the feedback clock signal or the delayed clock signal. The controller can be electrically connected to all features of the circuit, including, the PLL, the DLL, the VDL, the first multiplexer and the second multiplexer and can be configured to coordinate the process flow of the circuit.

Thus, for example, in order to measure cycle-to-cycle jitter, the controller can, through the multiplexers, transmit the initial clock signal (e.g., the clock signal output from the VCO of a PLL prior to division by a frequency divider) to the DLL and, subsequently, transmit both the initial clock signal from the PLL and the delayed clock signal from the DLL to the VDL. The VDL can then simultaneously propagate the initial clock signal and the delayed clock signal in order to acquire data indicating the phase differences between these two signals. If the initial clock signal from the VCO is two times the feedback clock signal (i.e., the PLL frequency divider is a divide by two) and if the predetermined phase shift is a one-half cycle delay, the acquired data indicating the phase differences between these two signals will be sufficient to allow for a cycle-to-cycle jitter measurement of the VCO by the processor.

Alternatively, in order to measure phase jitter, the controller can, through the multiplexers, transmit both the reference clock signal and the feedback clock signal (e.g., the clock signal output from the frequency divider of a PLL) to the VDL, bypassing the DLL.

The data indicating the phase differences between these two clock signals can be used by the processor to measure phase jitter.

Calibration of the delay elements is a design concern for BIST circuits. To allow for accurate calibration, the delay elements in at least one chain of the VDL should be identical to the delay elements in the DLL. More specifically, by using a level-sensitive scan design (LSSD) scan chain, it is easy to obtain data out of all the registers in the circuit, including those in the counter of the DLL. The DLL counter data gives information about the amount of delay elements inserted into the DLL delay chain to delay the initial clock signal by the predetermined amount (e.g., by one-half cycle). Thus, if the frequency of the initial clock signal is known, the delay of each delay element in the DLL chain can be estimated. The estimated delay of each DLL element can then be used to estimate the delay difference of the elements in the VDL.

Also disclosed are embodiments of an associated method of measuring clock signal jitter using a built-in self-test (BIST) circuit. The method can comprise coarsely tuning the circuit using a delay locked loop (DLL), finely tuning the circuit using a Vernier delay line (VDL), and processing data that is acquired during the tuning processes in order to measure jitter (e.g., either phase jitter or cycle-to-cycle jitter) of the clock signal.

More particularly, the method first comprises making a determination regarding whether to measure phase jitter or cycle-to-cycle jitter. Once the decision is made, then a controller and a plurality of multiplexers within the BIST circuit can be used to selectively connect the DLL and the VDL to the appropriate clock signals. For example, the DLL and the VDL can be selectively connected to an appropriate one of a reference clock signal, a feedback clock signal (e.g., the output of a frequency divider of a PLL), or an initial clock signal (e.g., the output of a voltage controlled oscillator (VCO) of a PLL). The VDL can further be selectively connected to an appropriate one of the reference clock signal, the feedback clock signal or the output of the DLL (i.e., a delayed clock signal).

Cycle-to cycle jitter can be measured using the following exemplary processes. A first multiplexer selectively connects the DLL and the VDL to an initial clock signal, for example, the output of a PLL voltage controlled oscillator (VCO) prior to division by a PLL frequency divider. The initial clock signal is received by the DLL and coarse tuning can be accomplished by using the DLL to incrementally delay this initial clock signal until a delayed clock signal with a predetermined phase shift from the initial clock signal is achieved and, then, by locking in that delayed clock signal. The second multiplexer then selectively connects the VDL to the output of the DLL. Thus, the VDL receives both initial clock signal and the delayed clock signal. Fine tuning can be accomplished by simultaneously propagating the initial clock signal and the delayed clock signal down parallel delay chains in the VDL and acquiring data regarding the phase differences between these two clock signals. This data can be stored using either logic circuits or counters and can be processed (e.g., by a processor) in order to measure the cycle-to-cycle jitter of the clock signal. If the initial clock signal from the VCO is two times the feedback clock signal (i.e., the frequency divider is a divide by two) and if the predetermined phase shift is a one-half cycle delay, the acquired data indicating the phase differences between these two signals will be sufficient to allow for a cycle-cycle jitter measurement of the VCO clock signal by the processor.

Alternatively, phase jitter can be measured using the following exemplary processes in which the DLL is bypassed. The first multiplexer can connect the VDL to a reference clock signal and the second multiplexer can connect the VDL to a feedback clock signal from the PLL (e.g., an output of a frequency divider). These clock signals are simultaneously propagated down parallel delay chains in the VDL and data is acquired regarding the phase differences between these two clock signals. This data can also be stored using either logic circuits or counters and can be processed (e.g., by a processor) in order to measure the phase jitter of the clock signal.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
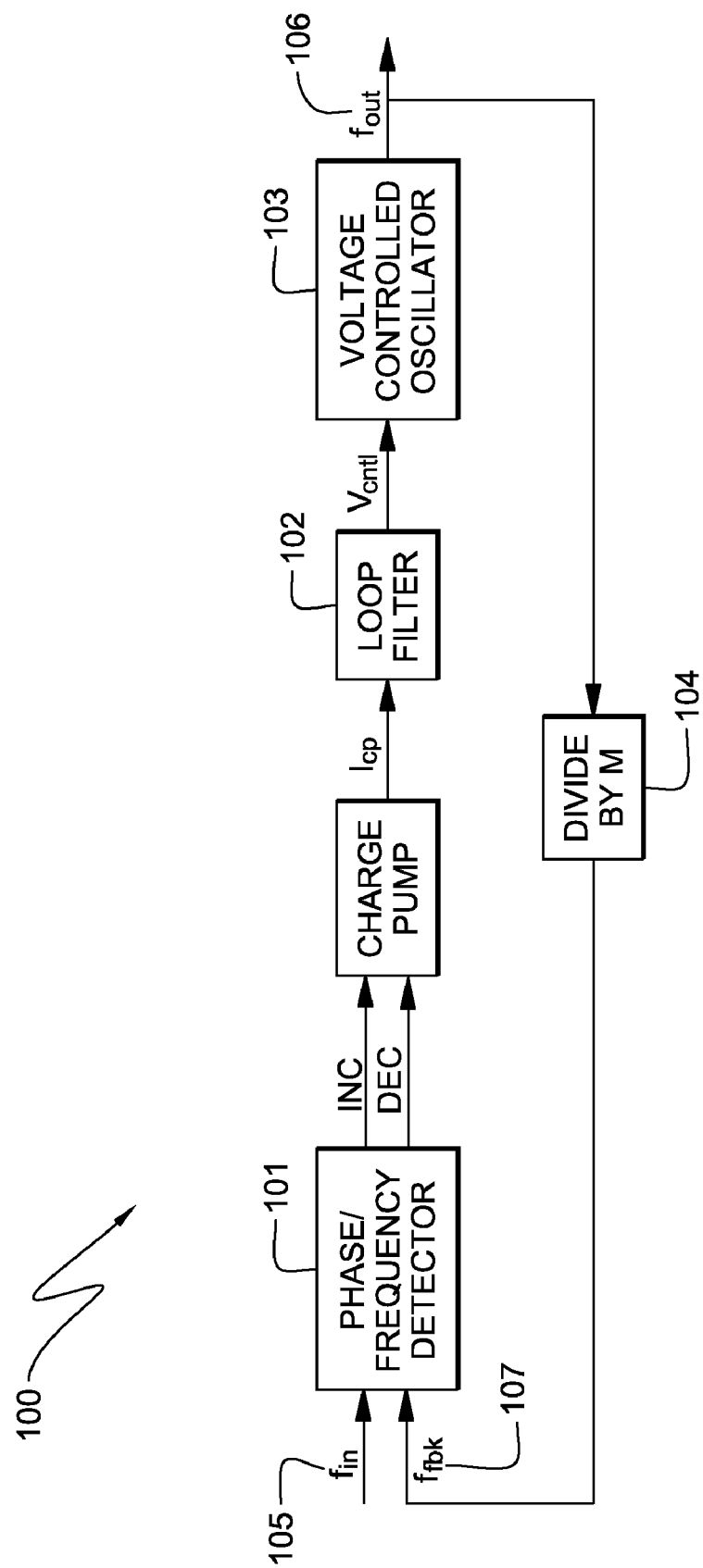
FIG. 1 is a schematic diagram illustrating a phase locked loop (PLL)

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Phase locked loops (commonly referred to as PLLs) are found in a large number of computer, wireless, and communication systems with many different applications such as clock recovery, frequency synthesis and clock noise filtration. In the last several decades, a rapid increase in the speeds of digital circuitry have put strenuous demands upon PLL designers. Referring to FIG. 1, a basic phase locked loop 100 contains several elements: a phase detector/comparator 101, a loop filter 102, a voltage-controlled oscillator (VCO) 103, and an optional frequency divider 104. The PLL uses negative feedback based on sensing the phase difference, via the phase detector 101, of the input frequency from a reference source (i.e., reference frequency $f_{in}$ 105) and the feedback frequency $f_{fbk}$ from the divide by M circuit 104. The output of the phase detector generates voltage pulses that depend on which input's phase is leading (or lagging) the other. For example, $f_{in}$ 105 might be operating at a slightly faster frequency than $f_{fbk}$ 107, thus the INC, or increase, signal would be asserted. This INC signal is sent to the charge pump, which can be represented by two voltage controlled current sources, one that sinks current and one that sources current. In this case, the INC signal would turn the top (or sourcing) current source on. This current, $I_{cp}$, is sent into the loop filter 102 and charges a capacitor. The loop filter 102 makes sure that the voltage on the capacitor changes gradually and prevents the spiking attributes that INC and DEC exhibit through its low pass behavior. As the capacitor charges, the value of the control voltage, $V_{cntl}$, slowly rises, and this is connected to the input of a voltage controlled oscillator. Since $V_{cntl}$ is increasing, the oscillation frequency will begin to increase as well, and this process continues until the feedback frequency 107 exactly equals the input frequency.

The divide by M circuit 104 shows one application of phase locked loops—the synthesis of a higher frequency than the input frequency. In this case, $f_{out}=M\times f_{fbk}$. When $f_{fbk}$ 107 is exactly the same as $f_{in}$ 105, the PLL 100 is said to be locked. If the input frequency 105 varies within a certain tolerance, the phase detector 101 will recognize the change and adjust the output frequency of the VCO 106 accordingly such that $f_{fbk}$ 107 still tracks $f_{in}$ 105.

One result of the increased speed requirements, discussed above, is that harmful noise parameters are becoming a relatively larger design problem. One such parameter, jitter, has quickly become one of the most critical parameters in specifying the operation of a PLL.

An agreement on the definition of jitter has historically been difficult to standardize. In regards to PLLs, it has vaguely been defined as the variation in period, frequency or phase of a signal as compared with its ideal value. However, as clock speeds have become much faster, jitter perturbations which have previously been insignificant are now beginning to affect circuit functionality. As jitter becomes an increasingly important metric in PLL performance specifications, ways of specifying different types of jitter have been created.

Four different types of jitter are generally recognized by those skilled in the art. The present invention is concerned with only phase jitter and the cycle-to-cycle jitter.

Figure 2:
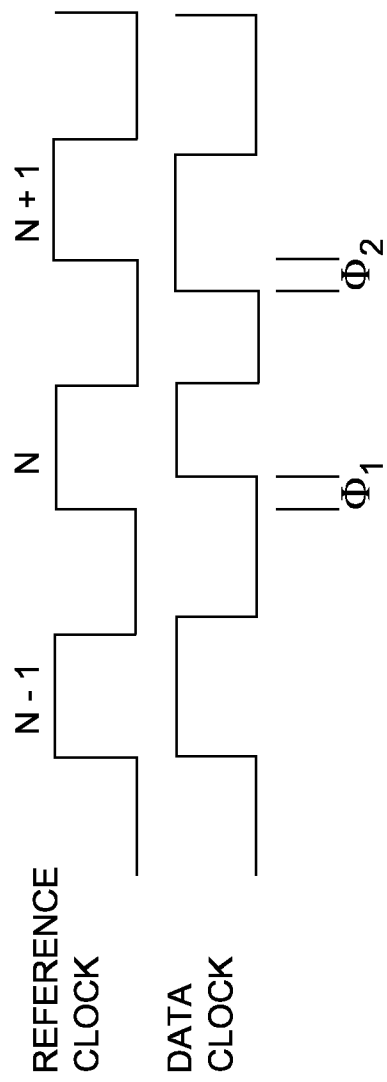
FIG. 2 is a schematic waveform diagram illustrating phase jitter.

Phase jitter refers to the deviation of the rising or falling edge of a data clock as compared to a reference clock and is depicted in FIG. 2. Phase jitter is a measure of the difference that occurs between the input and feedback signals of the PLL and is often what the phase/frequency detector is attempting to measure. Phase jitter is defined as $$J(NT)=\Phi_1-\Phi_{mean}$$

$$J((N+1)T)=\Phi_2-\Phi_{mean}$$

where $J(NT)$ refers to the phase jitter at cycle N, and $\Phi_{mean}$ refers to the mean value of the phase offset. Phase jitter is very important to quantify in applications such as communication systems. For example, too much phase jitter can often result in lost information in synchronous data transmission.

Figure 3:
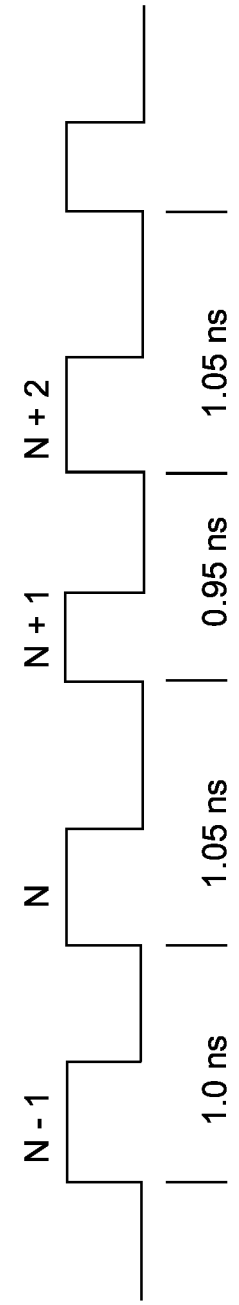
FIG. 3 is a schematic waveform diagram illustrating cycle-to-cycle jitter.

Cycle-to-cycle jitter refers to the deviation in period length of adjacent cycles of a signal and is depicted in FIG. 3. Cycle-to-cycle jitter is calculated by using the definition $$J_{cc}[N]=P[N]-P[N-1]$$

where P[N] denotes the period length of the Nth segment and $J_{cc}[n]$ is defined as the cycle-to-cycle jitter at sample n. In this example, the clock has an ideal frequency of 1 GHz with a period of 1 ns. During cycle n we see that the period is 1.05 ns and during cycle n+1 we see that the period is 0.95 ns. Thus, the cycle-to-cycle jitter for this cycle is −100 ps. However, in cycle n+2 the period is 1.05 ns, so the cycle-to-cycle jitter for this cycle is +100 ps. Therefore, the overall cycle-to-cycle jitter for this observed portion of the waveform is +/−100 ps.

Recent trends in jitter measurement have been towards on-chip devices, referred to as built-in self-test (BIST) circuitry. BIST circuits are typically physically very close to the circuit under test and have very easy access to internal nodes. BIST circuits can also lower testing cost compared to the aforementioned methods, as testing time can be accelerated and no additional testing hardware would be required. Several BIST methods including, amongst other methods, the delay line method and the Vernier delay line method have been developed.

Figure 4:
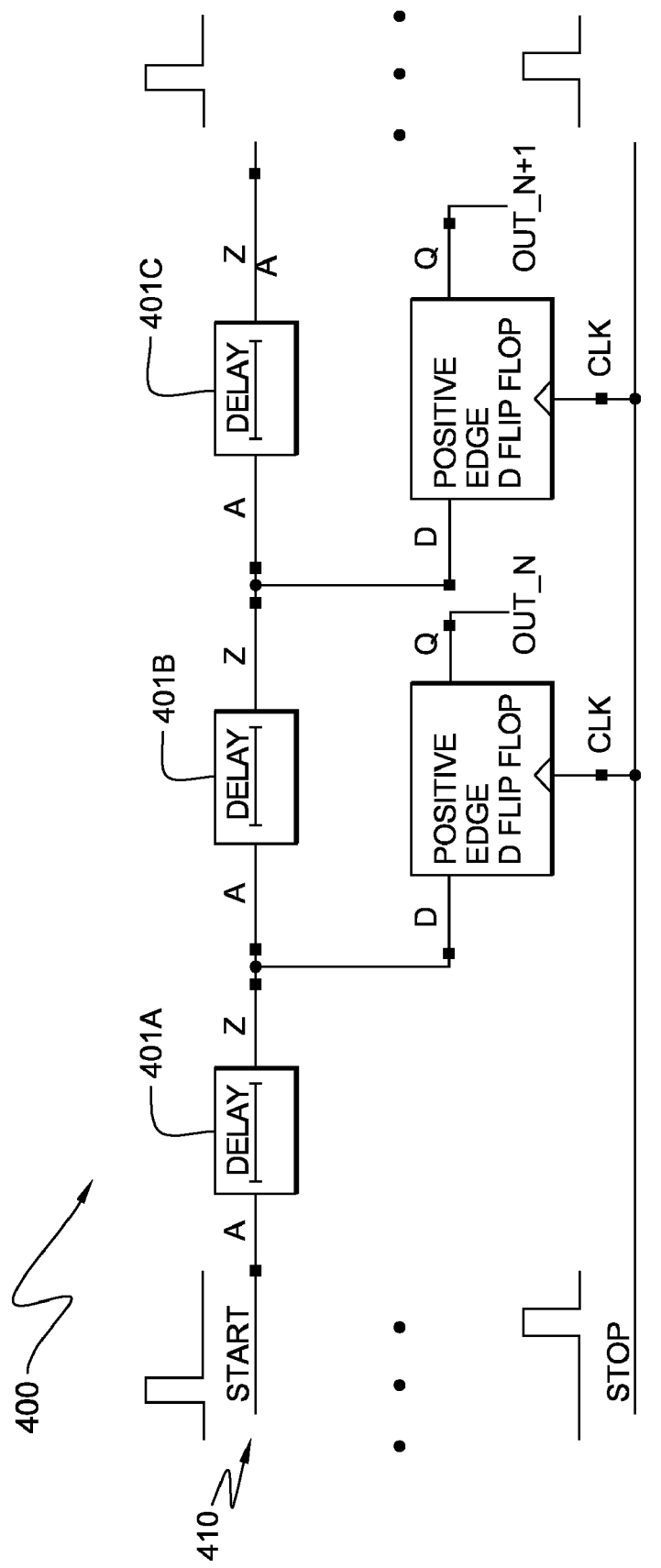
FIG. 4 is a schematic diagram illustrating a standard delay line.

A standard delay line 400 is illustrated in FIG. 4. The delay line 400 uses a string of delay elements 401a-c triggered at some point in time, usually representing the start of the time interval [1, 2, 3, 4]. The signal is then sent through a number of delay elements, and the output of each delay element is compared with a reference signal, usually representing the end of the time interval. In this manner, a thermometer code is generated that shows at which delay element the signals no longer overlap. Since the delay through each element will be known, it is simply a matter of counting the number on the thermometer code and multiplying it by the delay of each element to determine the time measurement. This method offers fast testing time, but its precision is limited by the delay of a delay element and it has a large area requirement because of all the delay cells required.

Figure 5:
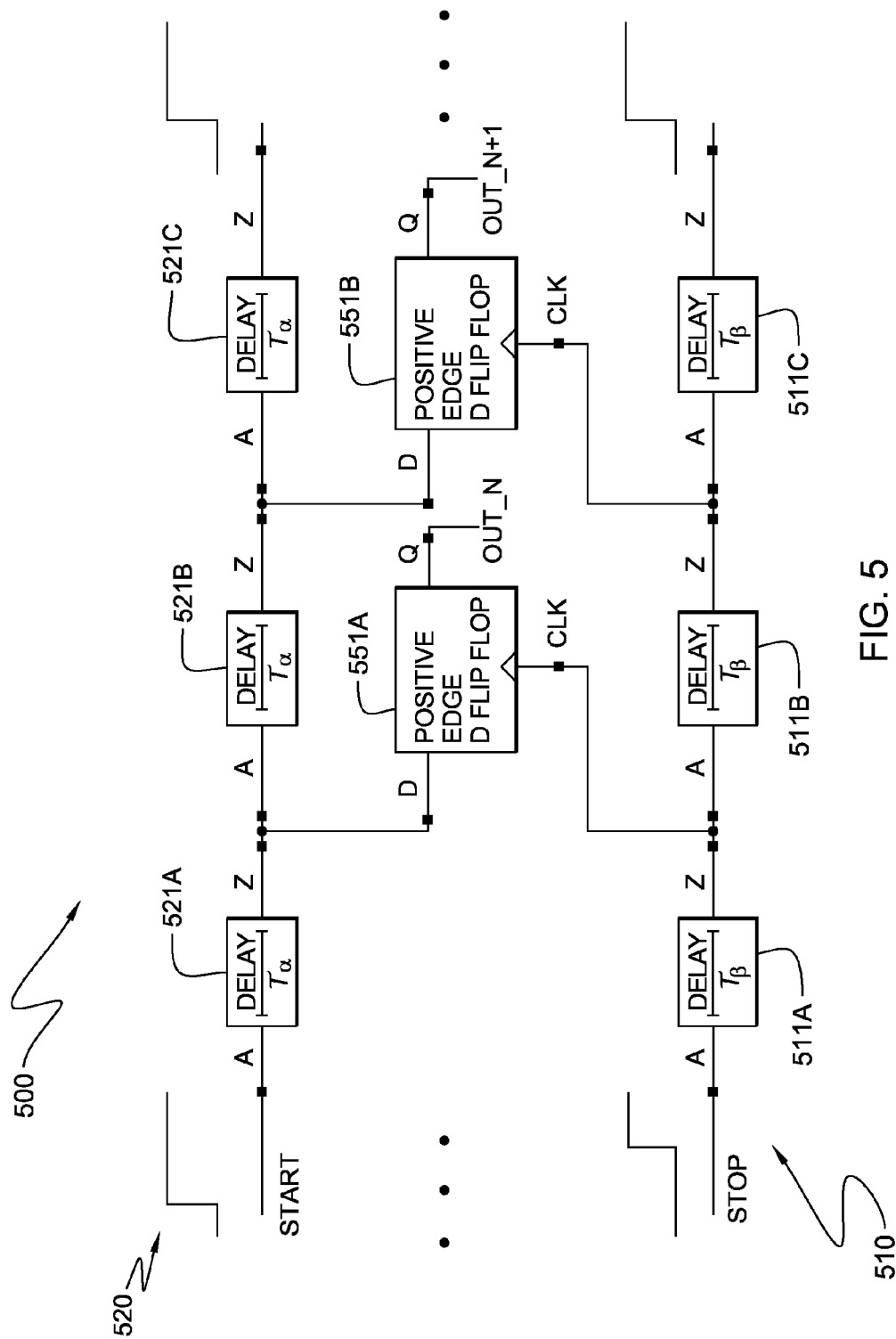
FIG. 5 is a schematic diagram illustrating a Vernier delay line.

If better resolution is required, the Vernier interpolation principle has proven to be a successful method for achieving sub-gate delay resolution [5, 6]. The Vernier delay line method relies on the small delay differences in two elements. A standard Vernier delay line 500 is illustrated in FIG. 5. The delay elements 511a-c in the STOP signal path (e.g., path 510) are shorter than the elements 521a-c in the START signal path (e.g., path 520). Thus, although START is triggered earlier than STOP, eventually the STOP signal catches up. A thermometer code can also be used to determine when this occurs, which can be formed at the output of each register stage. In this situation, the maximum possible resolution attainable is $\tau_a - \tau_\beta$. This method has fast testing time and very good precision, but like the delay line method of FIG. 4 it suffers from large area overhead.

Consequently, the prior art jitter measurement techniques required a tradeoff of area, precision, and time. However, due to the dramatic reduction of transistor sizes and new innovations in jitter measurement techniques, built-in self-test (BIST) solutions are now becoming a viable alternative to measuring jitter. Generally, a BIST solution is a circuit that is incorporated within an integrated to test all or part of its function. Specifically, designers have recently been looking towards these BIST solutions because in a high volume production setting, BIST solutions can offer a low-cost, accurate, and fast solution in determining jitter. Specifically, there is a need in the art for an improved BIST solution that creates or modifies existing architecture to obtain an overall improvement in performance. Thus, disclosed herein are embodiments of BIST circuit that can determine PLL jitter with increased accuracy over a wide input frequency range.

Therefore, disclosed herein are embodiments of an improved BIST circuit incorporated within an integrated circuit to measure phase and/or cycle-to-cycle jitter of a clock signal within that integrated circuit and an associated method of measuring phase and/or cycle-to-cycle jitter of a clock signal in an integrated circuit. The embodiments of the BIST circuit implement a Variable Vernier Digital Delay Locked Line method. Specifically, the embodiments of the BIST circuit of the invention incorporate both a digital delay locked loop and a Vernier delay line, for coarse tuning and fine tuning portions of the BIST circuit, respectively. Additionally, the BIST circuit is variable, as the resolution of the circuit changes from chip to chip, and digital, as it is implemented with CMOS technology.

Figure 6:
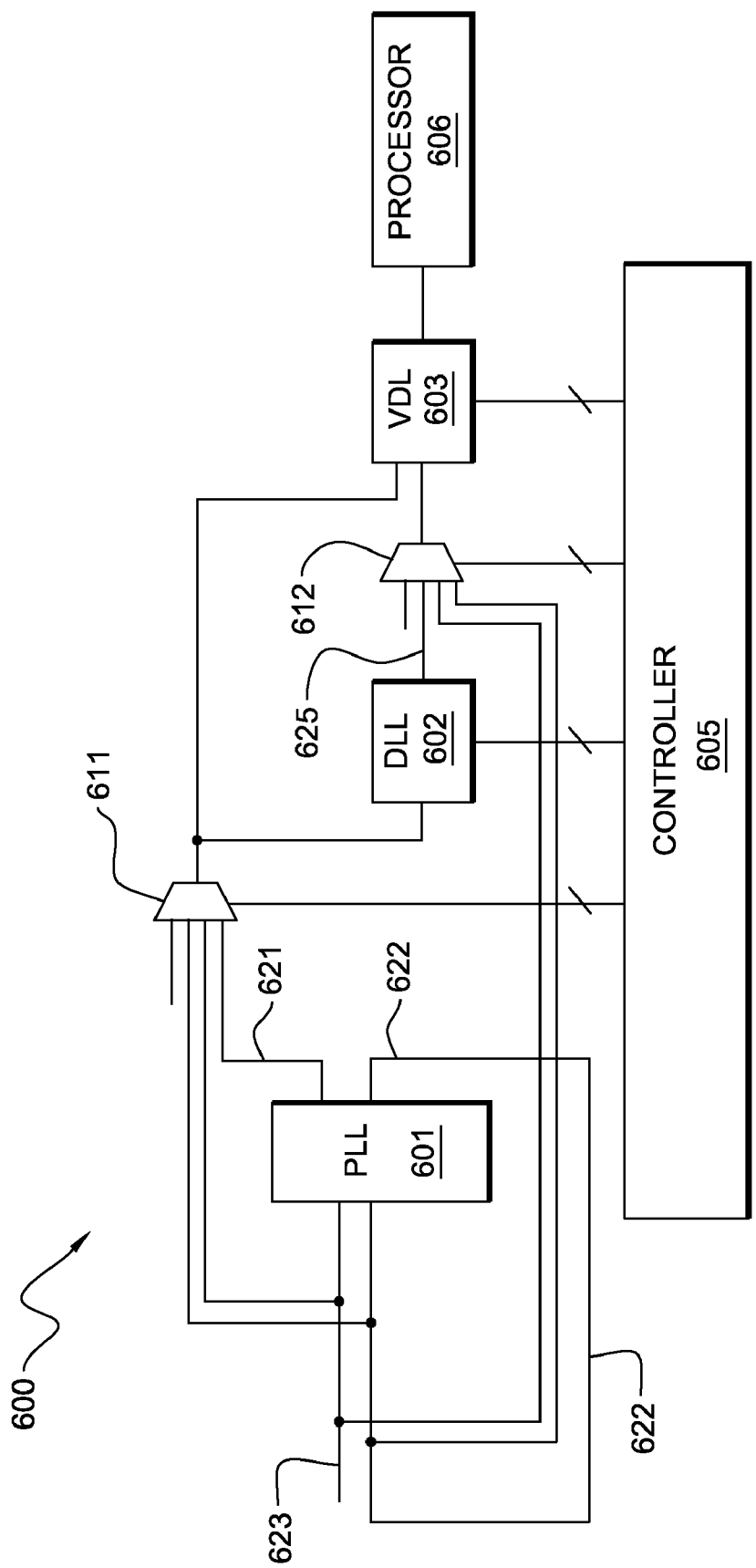
FIG. 6 is a schematic diagram illustrating an embodiment of the BIST circuit of the invention.

Referring to FIG. 6, disclosed herein are embodiments of a BIST circuit 600 for measuring clock signal jitter. The circuit 600 can comprises a clock signal generator 601, a delay locked loop (DLL) 602, a Vernier delay line (VDL) 603, a plurality of multiplexers 611, 612, a controller 605 and a processor 606.

The clock signal generator 601 can, for example, comprise a phase locked loop (PLL) that is configured to output a clock signal 621. An exemplary PLL is illustrated in FIG. 1 and described in detail above. Specifically, this PLL can comprise a phase detector/comparator 101, a loop filter 102, a voltage-controlled oscillator (VCO) 103, and an optional frequency divider 104. The PLL can be configured to use negative feedback based on sensing the phase difference, via the phase detector 101, of the input frequency from a reference source (see item 105 of FIG. 1 or item 623 of FIG. 6) and either the direct output frequency (i.e., an output clock signal) from the VCO 103 (see item 106 of FIG. 1 or item 621 of FIG. 6) or the output frequency (i.e., a feedback clock signal) from the optional frequency divider 104 (see item 107 of FIG. 1 or item 622 of FIG. 6), which divides the direct output signal of the VCO 103 by a predetermined amount (e.g., one-half).

Figure 7:
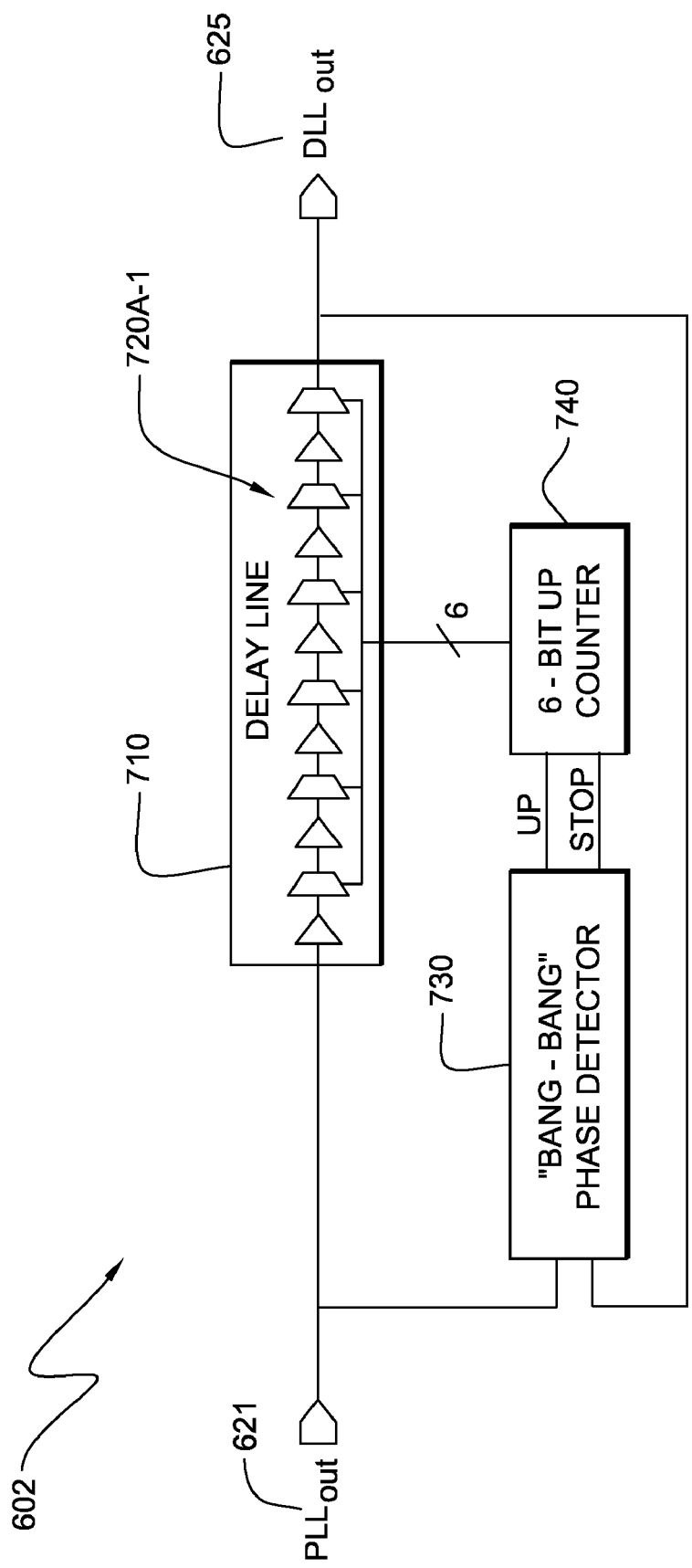
FIG. 7 is a schematic diagram illustrating an exemplary delay locked loop incorporated into the BIST circuit of FIG. 6.

Referring to FIG. 7, the delay locked loop (DLL) 602 is electrically connected to the clock signal generator 601 and is adapted to function as a coarse tune mode for jitter calculation (i.e., to lock the clock signal 621 from the PLL 601 half a period out of phase). It should be noted that in a typical implementation, the DLL would normally lock the clock signal one full period out of phase, but because the exemplary PLL 601 of the present invention has a frequency divider that divides by two, the subsequent measurements will actually be representative of cycle-to-cycle jitter (see more detailed explanation below). This DLL 602 can be configured to delay the clock signal 621, to lock the clock signal 621 when a predetermined phase shift is achieved, and, once locked, to output the clock signal 621 as a delayed clock signal 625. The DLL 602 can comprise a single delay chain 710 (i.e., a first delay chain), a phase detector 730 and a counter 740. The delay chain 710 can propagate the clock signal 621 from the clock signal generator (e.g., the clock signal output from the VCO of a PLL prior to division by a frequency divider) through a plurality of delay elements 720a-l (i.e., first delay elements) that are connected in series and are configured to delay the clock signal 621 until the predetermined phase shift is achieved. The phase detector 730 can be electrically connected to the first delay chain 710 and can be configured to determine if additional delay is required to achieve the predetermined phase shift. The counter 740 can be electrically connected to both the phase detector 730 and the first delay chain 710. It can either be configured to incrementally add delay to the first delay chain 710 if the additional delay is required or to lock in the clock signal 621 once the predetermined phase shift is achieved. Once the clock signal 621 is locked in, it is output as a delayed clock signal 625 to the Vernier delay line 603.

The Vernier delay line (VDL) 603 is electrically connected to both the clock signal generator 601 and the DLL 602 and is adapted to function as a fine tune mode for jitter calculation (i.e., to compare edge transitions between the clock signal 621 and the delayed clock signal 625). Specifically, the VDL 603 can be configured in a manner similar to the exemplary VDL 500 of FIG. 5. However, instead of START and STOP signal paths, the VDL 603 of the present invention is implemented to operate on two clock signals. That is the VDL can comprise two parallel delay chains 510 and 520 each comprising corresponding delay elements (i.e., a second delay chain 510 comprising a plurality of second delay elements 511a-c connected in series and a third delay chain 520 comprising a plurality of third delay elements 521a-c connected in series). These two delay chains 510, 520 can be configured to simultaneously propagate and delay different clock signals. The VDL can further be configured to acquire data from these delay chains 510, 520 that indicates the phase differences between the clock signals as they are propagated and to store that data (e.g., in logic circuits 551a-b (as illustrated) or counters (not shown). This data can be accessed by the processor (see item 606 of FIG. 6) and analyzed to measure jitter (e.g., phase jitter or cycle-to-cycle jitter depending upon the clock signals propagated).

Referring again to FIG. 6, the circuit 600 can also comprise a first multiplexer 611, a second multiplexer 612 and a controller 605. The first multiplexer 611 can be configured to selectively connect the DLL 602 and the VDL 603 to the reference clock signal 623, the feedback clock signal 622 from the PLL 601 (i.e., the output frequency of the PLL frequency divider) or the initial clock signal 621 from the PLL 601 (i.e., the output frequency of the PLL VCO). The second multiplexer 612 can be configured to selectively connect the VDL 603 to the reference clock signal 623, the feedback clock signal 622 or the delayed clock signal 625 from the DLL 602. The controller 605 can be electrically connected to all features of the circuit 600, including, the PLL 601, the DLL 602, the VDL 603, the first multiplexer 611 and the second multiplexer 612 and can be configured to coordinate the process flow of the circuit 600.

Thus, for example, in order to measure cycle-to-cycle jitter, the controller 605 can, through the multiplexers 611 and 612, transmit the initial clock signal 621 (e.g., the clock signal output from the VCO of a PLL prior to division by a frequency divider) to the DLL 603 and, subsequently, transmit both the initial clock signal 621 from the PLL 601 and the delayed clock signal 625 from the DLL 602 to the VDL 603. The VDL 603 can then simultaneously propagate the initial clock signal 621 and the delayed clock signal 625 in order to acquire data indicating the phase differences between these two signals. If the initial clock signal from the VCO is two times the feedback clock signal (i.e., the PLL frequency divider is a divide by two) and if the predetermined phase shift is a one-half cycle delay, the acquired data indicating the phase differences between these two signals 621, 625 will be sufficient to allow for a cycle-to-cycle jitter measurement by the processor 606.

Alternatively, in order to measure phase jitter, the controller 605 can, through the multiplexers 611 and 612, transmit both the reference clock signal 623 and the feedback clock signal 622 (e.g., the clock signal output from the frequency divider of a PLL) to the VDL 603, bypassing the DLL 602. The data indicating the phase differences between these two clock signals can be used by the processor 606 to measure phase jitter.

Calibration of the delay elements is a design concern for BIST circuits. To allow for accurate calibration, a row of delay elements (e.g., see delay elements 511*a-c* of FIG. 5) in the VDL should be identical to the delay elements (e.g., see delay elements 720*a-l* of FIG. 7) in the DLL. More specifically, by using a level-sensitive scan design (LSSD) scan chain, it is easy to obtain data out of all the registers in the circuit, including those in the counter of the DLL. The DLL counter data gives information about the amount of delay elements inserted into the DLL delay chain to delay the initial clock signal by the predetermined amount (e.g., by one-half cycle). Thus, if the frequency of the initial clock signal 621 is known, the delay of each delay element in the DLL chain can be estimated. The estimated delay of each DLL element can then be used to estimate the delay differences of the elements in the VDL.

Also, disclosed are embodiments of an associated method of measuring clock signal jitter using a built-in self-test (BIST) circuit 600.

Figure 8:
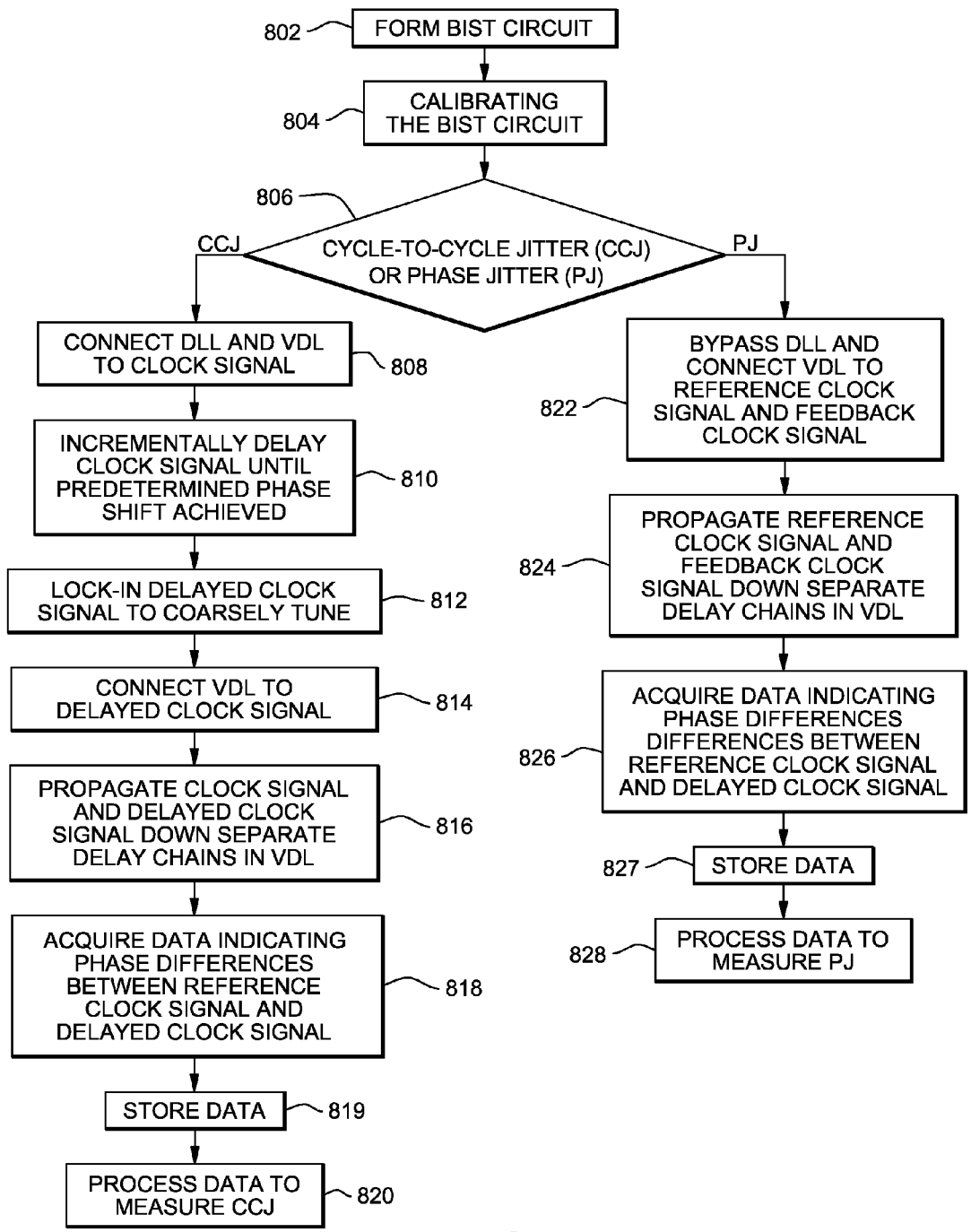
FIG. 8 is a flow diagram illustrating the operation of the BIST circuit.

Referring to FIG. 8, the method comprises coarsely tuning the circuit using a delay locked loop (DLL) to lock the clock signal half a period out of phase, finely tuning the circuit using a Vernier delay line (VDL) to compare the edges transitions of the clock signal and the out of phase clock signal (i.e., the delayed clock signal), and processing data that is acquired during the tuning processes in order to measure jitter (e.g., either phase jitter or cycle-to-cycle jitter) of the clock signal.

The embodiments of the method first comprise forming the BIST circuit 600, described above, 802 and calibrating the BIST circuit 804. Then, a determination regarding whether to measure phase jitter or cycle-to-cycle jitter is made 806. Once the decision is made at process 806, a controller and a plurality of multiplexers within the BIST circuit can be used to selectively connect the DLL and the VDL to the appropriate processes 808 or 822. For example, the DLL and the VDL can be selectively connected to an appropriate one of a reference clock signal, a feedback clock signal (e.g., the output of a frequency divider of a PLL), and an initial clock signal (e.g., the output of a voltage controlled oscillator (VCO) of a PLL). The VDL can further be selectively connected to an appropriate one of the reference clock signal, the feedback clock signal and the output of the DLL (i.e., a delayed clock signal).

Cycle-to cycle jitter can be measured using the following exemplary processes. A first multiplexer selectively connects the DLL and the VDL to an initial clock signal, for example, the output of a PLL voltage controlled oscillator (VCO) prior to division by a PLL frequency divider 808. The initial clock signal is received by the DLL and coarse tuning can be accomplished by using the DLL to incrementally delay this initial clock signal until a delayed clock signal with a predetermined phase shift from the initial clock signal is achieved 810 and, then, by locking in that delayed clock signal 812. The second multiplexer then selectively connects the VDL to the output of the DLL 814. Thus, the VDL receives both initial clock signal and the delayed clock signal. Fine tuning can be accomplished by simultaneously propagating the initial clock signal and the delayed clock signal down parallel delay chains in the VDL 816 and acquiring data regarding the phase differences between these two clock signals (i.e., comparing the edge transitions between the signals in the different delay lines) 818. This data can be stored 819 using either logic circuits or counters and can be processed (e.g., by a processor) in order to measure the cycle-to-cycle jitter of the clock signal 820. If the initial clock signal from the PLL VCO is two times the feedback clock signal (i.e., the PLL frequency divider is a divide by two) and if the predetermined phase shift in the DLL is a one-half cycle delay, the acquired data (at process 818) indicating the phase differences between these two signals will be sufficient to allow for a cycle-cycle jitter measurement by the processor.

Alternatively, phase jitter can be measured using the following exemplary processes in which the DLL is essentially bypassed. The first multiplexer can connect the VDL to a reference clock signal and the second multiplexer can connect the VDL to a feedback clock signal from the PLL (e.g., an output of a frequency divider) 822. These clock signals are simultaneously propagated down parallel delay chains in the VDL 824 and data is acquired regarding the phase differences between these two clock signals 826. This data can also be stored 827 using either logic circuits or counters and can be processed (e.g., by a processor) in order to measure the phase jitter of the clock signal 828.

More particularly, again referring to FIG. 6 in combination with FIG. 8, the BIST circuit 600 of the invention can incorporate a custom digital DLL 602 as a coarse tune and a VDL 603 as a fine tune. The BIST circuit 600 requires no external clock and, therefore, avoids a lot of testing complexity and noise issues. The only clock signal needed is acquired from the clock signal generator 601 (e.g., a PLL 100, as illustrated in FIG. 1) and all the measurements are taken using that signal. The BIST circuit 600 can accept frequency inputs between approximately 100 MHz-500 MHz. The BIST circuit 600 allows for variable, post-processed resolution determination to solve the problem of calibration as well as the overhead associated with it. This post-processed resolution determination is achieved through the use of the coarse tune circuit of the DLL and a matching of the elements in the DLL with the fine tune elements of the VDL. The BIST circuit 600 provides low jitter generation. Specifically, if a jitter measurement circuit adds too much jitter, it will corrupt the acquired data, and when the outputs of the circuit are read it will be unclear whether the data represents the jitter in the PLL signal or additional jitter from the BIST circuit. Therefore, the BIST circuit 600 is configured such that it adds only a minimal amount of jitter to the PLL signal. Additionally, the BIST circuit 600 provides small area overhead on the PLL. That is, the footprint of this BIST circuit 600 can be approximately 5-10% the area of a single PLL. Also, the area overhead can be amortized by the fact that the BIST circuit 600 can be used to test multiple PLLs on a chip via the introduction of a simple multiplexer.

There are several different modes of operation for the BIST circuit 600. These modes of operation are controlled by test bits and some decode logic. As discussed above, the embodiments of the BIST circuit 600 can make two types of jitter measurements: phase jitter and cycle-to-cycle jitter measurements. Also, external inputs can be used to facilitate the characterization of circuit 600. For example, as illustrated in the Table 1, below, the setting corresponds to a type of measurement.

TABLE 1

| TEST | Type of Measurement |
| --- | --- |
| 000 | PLLout cycle-to-cycle jitter |
| 001 | FBKclk cycle-to-cycle jitter |
| 010 | REFclk cycle-to-cycle jitter |
| 011 | External cycle-to-cycle jitter |
| 100 | REFclk – FBKclk phase jitter |
| 110 | External phase jitter |

Implementation of a phase jitter measurement (at process 828 of FIG. 8) primarily utilizes the VDL. The signals used to make this measurement are the feedback clock signal (FBKclk) 622 and the reference clock signal (REFclk) 623. The phase difference between the rising edges of these signals 622, 623 (acquired at process 826) denotes the phase jitter of the system. These signals 622, 623 are sent to the VDL 603 (at process 824) after some delay logic that centers the output code in the middle of the chain. The basic operation of the VDL 603 is described above in conjunction with the exemplary VDL 500 of FIG. 5. Both FBKclk and REFclk signals 622, 623 propagate down the Vernier chain 603 for as many periods of the PLLout clock as determined by the tester. The data is accumulated for peak-to-peak, cycle-to-cycle jitter data using "sticky logic," which is inspired by the Skitter Macro [7]. Then, after the data is extracted by the test engineer via a level-sensitive scan design (LSSD) test methodology, the system is reset and put on idle.

Implementation of a cycle-to-cycle jitter measurement (at process 820 of FIG. 8) utilizes both the DLL and the VDL. As mentioned above, cycle-to-cycle jitter refers to the difference in adjacent period lengths of a signal. The cycle-to-cycle jitter measurement in the present method is implemented in two stages. First is the DLL stage, during which the BIST circuit 600 takes either PLLout 621, REFclk 623, or FBKclk 622 as the input, depending on the value of the TEST bits. This input is sent to the digital DLL 602, which delays the signal to almost 180° out of phase and outputs DLLout (i.e., the delayed clock signal 625). Referring to FIG. 7, the DLL 602 can comprise a phase detector 730 with bang-bang phase detection logic, a digital counter 740, and an adjustable delay line 710. Once DLLout 625 has the appropriate amount of delay, the DLL 602 becomes locked, and triggers the VDL stage. Specifically, the delayed clock signal 625 from the DLL 602 and the inverted input signal 621 from the PLL 601 both propagate down the Vernier chain in the same manner as FBKclk 622 and REFclk 623, described above.

The circuit 600 operates on a cycle-to-cycle jitter with only the 180° shift (i.e., the one-half cycle delay) instead of a 360° shift (i.e., a full-cycle delay) because the VCO in the PLL operates very quickly and a divide by two is incorporated within the VCO circuit to slow down the oscillation. Thus, although it may seem as if the BIST circuit 600 is only measuring a duty cycle jitter, since the actual period of the feedback clock signal 622 is half that of PLLout 621 this technique ultimately does measure cycle-to-cycle jitter.

Those skilled in the art will recognize that the delay elements are critical to the performance and precision of the BIST circuit 600. The resolution of the circuit 600 depends upon a delay mismatch in the two signal paths. To create that mismatch, differently sized buffer delays were created using a cascade of active inverters. Ideally, the delay blocks would be comprised of elements that are more insensitive to process/voltage/temperature variations, although such a requirement is not necessary.

Referring to FIG. 7, the delay locked loop (DLL) 602 can, for example, be much simpler than those found as commercial stand-alone units because of the area requirement and the specific function it performs. The DLL 602 can comprise a delay line 710 comprising a plurality of delay elements 720*a-l* connected in series, a phase detector 730 and a counter 740. The DLL 602 can further be implemented in a self-timed, all digital fashion to eliminate delay perturbations once locked. In analog DLLs, there is often a charge pump and low pass filter that connects to a voltage controlled delay element, similar to the PLL 100 of FIG. 1. However, since the charge pump still charges and discharges even after the lock condition is reached, there would always be fluctuations of the voltage on the capacitor. This situation leads to fluctuations of the delay values and consequently a signal with more jitter. The digital DLL 602 in the circuit 600 of the present invention does not suffer from this jitter problem because once the lock condition is reached, the system truly exhibits a constant delay. In other words, a typical DLL will continue to make corrections even after the lock condition is reached, resulting in quantization jitter. The DLL 602 in this design freezes the DLL once locked, so this quantization error is eliminated. Many digital DLLs in commercial parts use complex techniques to achieve very accurate locks, such as phase blending or using multiple delay lines. However, this extra complexity and area cost is unnecessary for this application, because the centering ability of the DLL 602 is sufficient as a coarse tune required for the present invention.

The phase detector 730 can, for example, be implemented with simple bang-bang logic. For example, a single rising edge D flip flop can be used to determine whether or not DLLout 625 requires more delay. The CLK input to the flip flop is the inverted PLL signal 621, denoted as PLLout_B, while the D input is simply the output of the delay line, DLLout 625. The PLL signal 621 is inverted because the phase detector 730 is looking for a 180° lock, as described above. Until the rising edge of DLLout 625 occurs after the rising edge of PLLout_B, the UP signal will continue to pulse.

The counter 740 can, for example, comprise a simple synchronous 6-bit up counter with RESET and HALT. Each module can represent a one-bit adder. The counter 740 can comprise three modes of operation. The first mode can be the resetting of the counter 740. The reset can be enabled via a muxing of the clock and data inputs, which is decided by the control logic. The second mode is the count mode, used when the DLL 602 is in operation. The circuit counts incrementally from 0 to 63 and adds the appropriate amount of delay depending on the count (at process 810). The third mode is the halt mode, which occurs when the DLL 602 has locked onto the input signal (at process 812) and the VDL is put in operation (at process 814). This mode forces the counter to hold its outputs, thus the counter has logic to prevent them from incrementing, even if there is an UP pulse indicating that it should do so.

Figure 9:
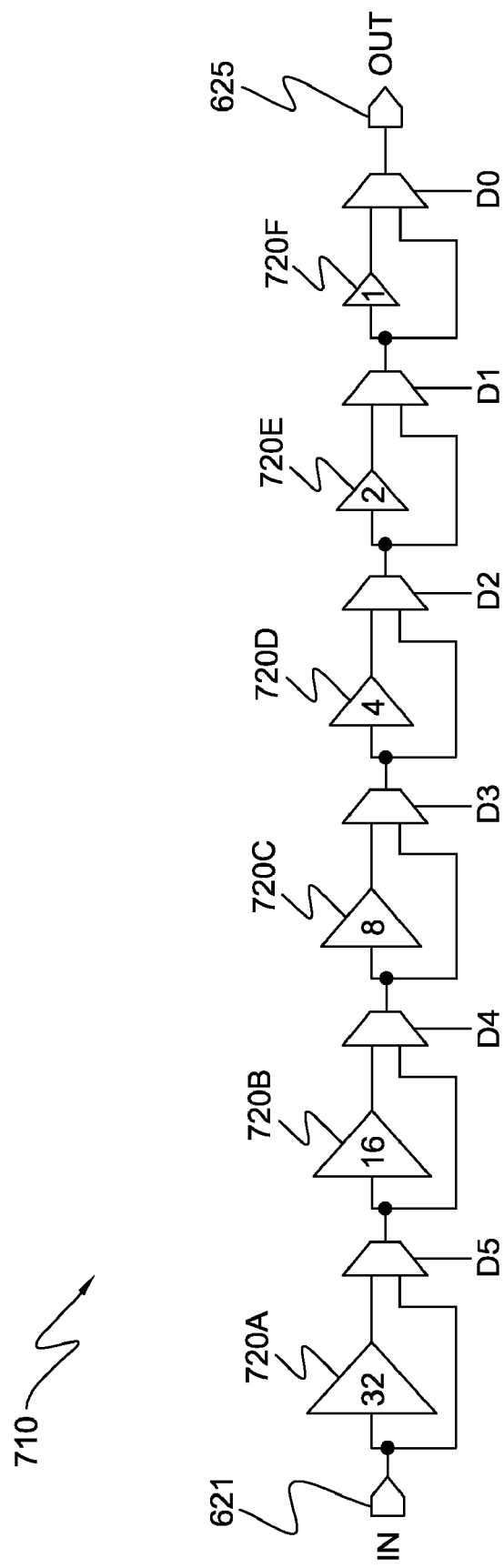
FIG. 9 is a schematic diagram of the binary weighted delay line.

The delay line 710 can, for example, comprise a 64-tap binary weighted delay element. The amount of delay depends upon the 6-bit count output of the counter 740. FIG. 9 is a schematic diagram illustrating an exemplary binary weighted delay line. The delays in the signal clock 621 can be created by using multiplexing elements D5, D4, etc., which are controlled by the counter 740 outputs. Those skilled in the art will recognize that the propagation delay of such multiplexing elements D5, D4, etc. as well as the intrinsic wire delays can contribute significantly to the overall delay in the delay line. As will be discussed below, for calibration purposes it is crucial that the delay introduced in the delay line is a result of only the delay elements. Thus, the propagation delay of the multiplexing elements D5, D4, etc. are matched in the PLL signal path and careful layout is also considered.

Figure 10:
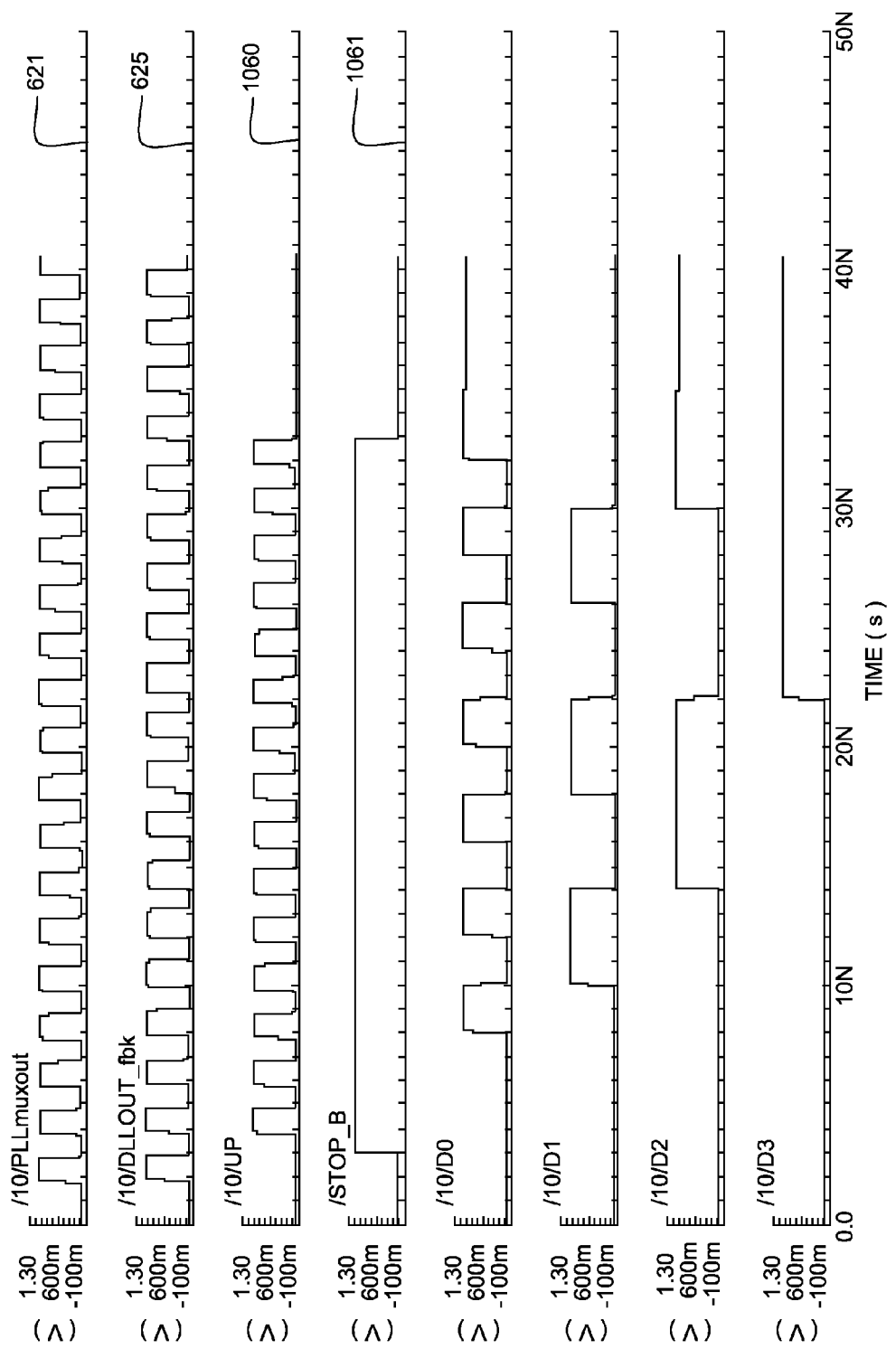
FIG. 10 is an exemplary delay locked loop timing diagram.

The timing diagram in FIG. 10 illustrates the operation of the exemplary DLL 602 of FIG. 7. The delay through the delay line 710 is initialized to zero to eliminate the problem of locking on the wrong edge, for example locking 180° or 360° away from the desired target. When the control circuitry enables the DLL 602, DLLout 625 is slightly delayed with respect to the input, PLLout 621. At this time, the phase detector realizes that DLLout 625 requires more delay so it begins sending UP pulses 1060 to the counter 740, which controls the delay line 710 and increases the amount of delay between DLLout 625 and PLLout 621. The UP signal 1060 continues to pulse until DLLout is almost 180° out of phase with respect to PLLout 621. When this occurs, the UP signal 1060 will stop pulsing, and a STOP signal 1061 is then asserted and sent to the control unit indicating the DLL 602 has locked. In the diagram, note that STOP is active low. As mentioned earlier, the reason the DLL 602 is completely frozen once locked is to eliminate the quantization jitter that occurs in typical DLLs. Although this reduces the accuracy of its lock, the lock is still sufficient, since the DLL 602 operates as a coarse tuner for the BIST circuit 600.

Figure 11:
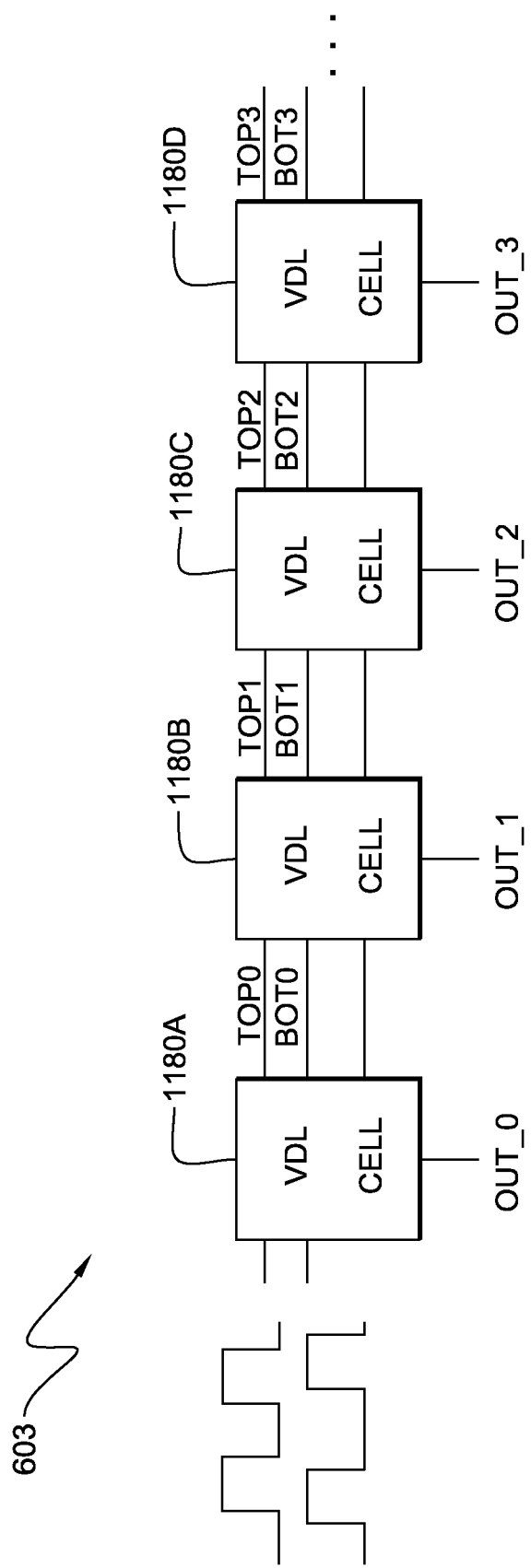
FIG. 11 is a schematic diagram illustrating an exemplary Vernier delay line incorporated into the BIST circuit of FIG. 6.

Referring to FIG. 11, the VDL 603 can, for example, comprise Vernier cells (e.g., 60 cells 1180*a*, 1180*b*, etc.) connected serially. As discussed above, the Vernier method offers a resolution that is the difference between two delay cells. However, instead of START and STOP paths, the VDL 603 of the present invention is implemented to operate on two clock signals, PLLout_B 621 and DLLout 625. Since the DLL 602 locks at 180° out of phase, the inversion is required. When these cells 1180*a*, 1180*b*, etc., are chained together, a thermometer code for each pair of rising edge transitions can be generated. If there is a jittery input signal, this will cause a change in the temporal location of the rising edge of the top signal and will lead to a change in the spatial location of the transition point in the thermometer code. Measuring the change in this transition point gives information about the amount of jitter in the input signal.

At processes 819 and 827, the VDL 602 can employ logic circuits or counters to store the data acquired at processes 818 and 826, respectively. For example, each Vernier cell 1180*a*, 1180*b*, etc., can, for example, employ "sticky" logic to store the collected data. This logic can be implemented as follows: XOR-type logic can be used after the first flip flop to convert the thermometer code into a code that locates the transition point. This data can be fed into some combinational logic and another flip flop which can be used to acquire the peak-to-peak jitter data. This logic remembers where each transition point happens for the duration that the test is active, as illustrated in Table 2.

TABLE 2

| Vernier Cell | | |
|---|---|---|
| OutCode | 00000000000000000000 | Initialized |
| HitCode | 11111111000000000000 | After 1 rising edge |
| OutCode | 00000000100000000000 | |
| HitCode | 11111111111100000000 | After 2 rising edges |
| OutCode | 00000000100010000000 | |
| HitCode | 11111111111000000000 | After 3 rising edges |
| OutCode | 00000000100110000000 | |
| OutCode | 00000011111111110000 | After N rising edges |

Table 2 illustrates an exemplary VDL 602 that is 20 cells long. HitCode refers to the thermometer code output, and OutCode refers to the output of the sticky logic. When the circuit is initialized, the control logic resets OutCode. After the first rising edge appears, the thermometer code from HitCode is translated into a single transition point on OutCode. Then, assuming a jittery input signal, the transition point will occur at a different cell location on the second rising edge. However, because of the sticky logic mechanism, the first transition point is still stored on OutCode. Thus, after N rising edges, OutCode will have a string of 1's which represent different transition points of the input signal.

One drawback of the sticky logic method is that it only provides a worst case estimation for the jitter. Since the BIST circuit 600 is measuring cycle-to-cycle jitter, this is a peak-to-peak, cycle-to-cycle jitter measurement. However, it is very area efficient, because it only requires two flip flops and some combination logic per Vernier cell.

Alternatively, large counters may be used to store the transition data of each bit. By using large counters and exercising the VDL over many cycles, a probability distribution function can be generated, and external processing software can obtain many valuable results from the data, such as RMS and peak-to-peak jitter and possibly even the deterministic jitter and random jitter components. However, these large counters require a significant amount of area, which would have been unacceptable in this implementation and is the reason that the sticky logic method is used.

Data acquisition at processes 818 and 826 can be accomplished, for example, through a scan chain via a conventional Level Sensitive Scan Design (LSSD) protocol (e.g., see [8]). This data acquisition is implemented with little design modification and allows for all the data generated in the BIST circuit 600 to be extracted serially through the scan chain instead of using an I/O pin for each signal, which is infeasible. This LSSD is used solely for data acquisition and not for extensive testing of the circuit.

Figure 12:
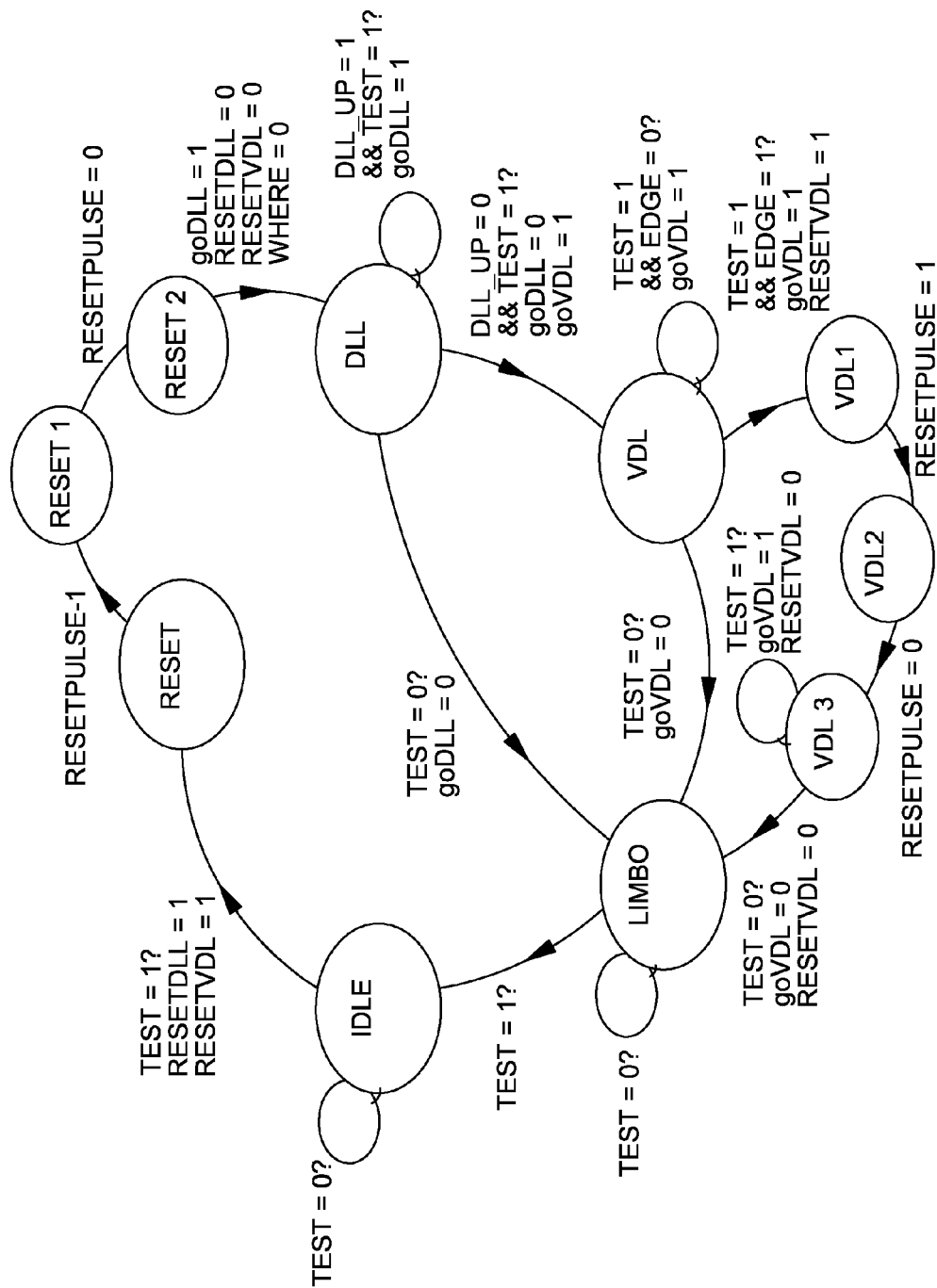
FIG. 12 represents an exemplary state transition diagram for the controller 605 of FIG. 6.

Referring again to FIG. 6, the controller 605 of the BIST circuit 600 can, for example, comprise a finite state machine (FSM) that describes the process flow of the system. FIG. 12 represents an exemplary state transition diagram that illustrates this flow. Registers are clocked by the PLLout signal 621 instead of a global reference clock. The system 600 can be implemented such that regardless of the start up conditions, the circuit will ultimately initialize at the IDLE or LIMBO state before the test begins. At the rising edge of the TEST signal, the system will begin its reset sequence that will ensure the delay in the DLL delay line is at zero and that the Vernier cell outputs are all at zero as well. Then, the system will enter the DLL state (at process 810 of FIG. 8). During this state, all the reset signals are asserted low, and the goDLL signal is asserted high, which triggers the DLL. This state is valid until either the TEST signal is asserted low or the DLL has completed its task (at process 812 of FIG. 8). In normal operation, after the DLL has locked, TEST=1 and DLL_UP=0, which will cause a transition into the VDL state (at process 814 of FIG. 8). The VDL state will freeze the DLL output by forcing goDLL=0 and will turn on the VDL by asserting go VDL=1. The VDL will continue to run and collect data until the tester tells it to stop by making TEST=0 or if an edge case is detected (at process 818 of FIG. 8). If an edge case is detected, the FSM will enter the smaller loop that will reset the values in the VDL and then begin again, as indicated by states VDL1, VDL2 and VDL3.

Calibration of delay elements has always been a serious issue in designing precise jitter measurement BIST circuits. Process, temperature, and voltage variations can alter delay elements by a factor of 4-5 in magnitude. Many prior art designs of delay elements have attempted to set a specific attainable resolution and have built feedback systems for their delay elements to guard against environmental changes [24]. However, such efforts have been shown to significantly increase the circuit area and complexity with mixed results. Therefore, the embodiments of the BIST circuit 600 of the present invention provide a BIST structure that optimizes area and still attain the required resolution. To accomplish this a dynamic time resolution is used that has a dependence on process parameters. One natural question that arises is: Since the resolution is variable, how does one know what the resolution actually is given a specific hardware implementation? This can be accomplished, for example, by using identical delay elements in the DLL 602 and the VDL 603. When using a LSSD scan chain, it is easy to obtain data out of all the registers in the circuit 600, including those of the counter 740 in the DLL 602 (see FIG. 7). The counter data gives information about the amount of delay elements inserted into the DLL delay line 710 to delay the input signal by half a period. Thus, if the frequency of the input signal is known, it is easy to estimate the delay value of each delay element 720a-l by the following equation:

$$t_{PD\_DLLDELAY} = \frac{\frac{1}{2}\frac{1}{f}}{COUNT(0-5)}$$

with $t_{PD\_DLLDELAY}$ referring to the delay of each element in the DLL, $$f\left(or\frac{1}{f}\right)$$

referring to the frequency (or period) of the input signal, and COUNT(0-5) referring to the decimal value of the 6 count bits. Given $T_{PD\_DLLDELAY}$, the delay through one element in the bottom chain, ($t_{PD\_BOTDELAY}$), is knowable, because the circuit 600 is designed such that $T_{PD\_DLLDELAY}=2\times t_{PD\_BOTDELAY}$. Although concrete information about the actual resolution, i.e. $|t_{PD\_TOPDELAY}-t_{PD\_BOTDELAY}|$, is still not known, having information about the delay of one type of delay element can accurately give information about the difference between the delay of two types of delay elements.

Jitter produced within the embodiments of the BIST circuit 600 should be minimized as much as possible. Such jitter will make the BIST circuit 600 less accurate because there would be uncertainty as to whether the observed jitter originated from the input signal or from the testing circuitry. As mentioned above, it is anticipated that the primary use of this circuit will be during manufacturing test, when the power supply for the circuit is very stable. Thus, assuming that most of the jitter would be coming from noisy power supplies, the other concern becomes jitter from temperature variation and transistor noise in the signal path. During circuit characterization the noise floor will be determined and taken into account in the future measurements.

Careful layout is essential for the embodiments of the BIST circuit 600, as the architecture relies on closely matched signal paths to minimize timing errors. For example, in consideration of time constraints, the control block 605 and portions of the DLL 602 can be implemented using place and route technology as they did not contain any timing critical or noise sensitive signal paths. However, the actual signal path of the input signal and the delayed signal should be matched carefully in the VDL 603 and the DLL 602 delay line.

Therefore, disclosed above are embodiments of an improved BIST circuit and an associated method of measuring jitter. The improved BIST circuit implements a Variable Vernier Digital Delay Locked Line method. Specifically, the embodiments of the BIST circuit of the invention incorporate both a digital delay locked loop and a Vernier delay line, for coarse tuning and fine tuning portions of the BIST circuit, respectively. Additionally, the BIST circuit is variable, as the resolution of the circuit changes from chip to chip, and digital, as it is implemented with CMOS technology. This improved BIST circuit is capable of measuring phase and/or cycle-to-cycle jitter of a clock signal and is capable of resolving time differences on the order of picoseconds (e.g., to achieve a time resolution of less than 15 ps). The improved circuit is further functional for a wide range of input frequencies (e.g., 100 MHz to 500 MHz), is self-clocked, requires a small silicon area (e.g., approximately 10% of the area of the PLL), provides fast testing time, and is compatible with level-sensitive scan design test.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

REFERENCES

Makoto Takamlya, Hiroki Inohara, and Masayuki Mizuno. On-chip jitter-spectrum-analyzer for high-speed digital designs. IEEE International Solid-State Circuits Conference, 1:350-352, February 2004.

Timo E. Rahkonen and Juha T. Kostamovaara. The use of stabilized cmos delay lines for the digitization of short time intervals. IEEE Journal of Solid-State Circuits, 28(8):887-894, August 1993.

U.S. Pat. No. 6,661,266, titled "All Digital Built-In Self-Test Circuit For Phase-Locked Loops", issued on Dec. 9, 2003 to Variyam et al and incorporated herein by reference.

U.S. Pat. No. 5,889,435 titled "On-chip PLL phase and jitter self-test circuit" issued on Mar. 30, 1999 to Smith, et al. and incorporated herein by reference.

Piotr Dudek, Stanislaw Szczepanski, and John V. Hatfield. A high-resolution cmos time-to-digital converter utilizing a vernier delay line. IEEE Transactions on Solid-State Circuits, 35(2):240-247, February 2000.

Antonio H. Chan and Gordon W. Roberts. A jitter characterization system using a component-invariant vernier delay line. IEEE Transactions on Very Large Scale Integration (VLSI) Systems, 12(1):79-95, January 2004.

Phillip J. Restle, Robert L. Franch, Norman K. James, William V. Huott, Timothy M. Skergan, Steven C. Wilson, Nicole S. Schwartz, and Joachim G. Clabes. Timing uncertainty measurements on the power5 microprocessor. In 2004 IEEE International Solid-State Circuits Conference, February 2004.

Robert W. Bassett, Mark E. Turner, Jeannie H. Panner, Pamela S. Gillis, Steven F. Oakland, and Douglas W. Stout. Boundary-scan design principles for efficient lssd asic testing. IBM Journal of Research and Development, 34(2):339-354, March 1990.

What is claimed is:

1. A circuit to measure clock signal jitter, said circuit comprising:
    a clock signal generator configured to output a clock signal;
    an on-chip delay locked loop electrically connected to said generator and configured to delay said clock signal, to lock said clock signal when a predetermined phase shift is achieved, and, once locked, to output said clock signal as a delayed clock signal; and
    an on-chip Vernier delay line electrically connected to said generator and said delay locked loop and configured to simultaneously propagate said clock signal and said delayed clock signal and to acquire data indicating phase differences between said clock signal and said delayed clock signal; a processor adapted to access said data and to measure cycle-to-cycle jitter of said clock signal based on said data.

2. The circuit of claim 1, wherein said delay locked loop comprises:
    a first delay chain comprising a plurality of first delay elements connected in series and configured to delay said clock signal;
    a phase detector connected to said first delay chain and configured to determine if additional delay is required to achieve said predetermined phase shift; and
    a counter connected to said phase detector and said first delay chain and configured to incrementally add delay to said first delay chain if said additional delay is required.

3. The circuit of claim 2 wherein said Vernier delay line comprises:
    a second delay chain comprising a plurality of second delay elements connected in series; and
    a third delay chain comprising a plurality of third delay elements connected in series,
    wherein said second delay chain and said third delay chain are configured to simultaneously delay different clock signals, and
    wherein said second delay elements are identical to said first delay elements to allow for accurate calibration of said circuit.

4. A circuit to measure clock signal jitter, said circuit comprising:
    an on-chip phase locked loop configured to output a clock signal;
    an on-chip delay locked loop electrically connected to said phase locked loop and configured to delay said clock signal, to lock said clock signal when a predetermined phase shift is achieved, and to output said clock signal, once locked, as a delayed clock signal; and
    an on-chip Vernier delay line electrically connected to said phase locked loop and to said delay locked loop and configured to simultaneously propagate said clock signal and said delayed clock signal and to acquire data indicating phase differences between said clock signal and said delayed clock signal; a processor adapted to access said data and to measure cycle-to-cycle jitter of said clock signal based on said data.

5. The circuit of claim 4, wherein said delay locked loop comprises:
    a first delay chain comprising a plurality of first delay elements connected in series and configured to delay said clock signal;
    a phase detector connected to said first delay chain and configured to determine if additional delay is required to achieve said predetermined phase shift; and
    a counter connected to said phase detector and said first delay chain and configured to incrementally add delay to said first delay chain if said additional delay is required.

6. The circuit of claim 5, wherein said Vernier delay line comprises:
    a second delay chain comprising a plurality of second delay elements connected in series; and
    a third delay chain comprising a plurality of third delay elements connected in series,
    wherein said second delay chain and said third delay chain are configured to simultaneously delay different clock signals, and
    wherein said second delay elements are identical to said first delay elements to allow for accurate calibration of said circuit.

7. The circuit of claim 6, wherein said phase lock loop comprises a frequency divider adapted to divide a frequency of said clock signal by two in order to produce a feedback clock signal and wherein said predetermined phase shift comprises a one-half cycle delay.

8. The circuit of claim 7, further comprising a processor adapted to access said data and to measure cycle-to-cycle jitter of said clock signal based on said data, wherein said clock signal comprises a voltage controlled oscillator clock signal and wherein because said clock signal is two times said feedback clock signal, said one-half cycle delay is sufficient to allow for a cycle-to-cycle jitter measurement of said voltage controlled oscillator clock signal.

9. The circuit of claim 7, wherein said Vernier delay line is further configured to simultaneously propagate said feedback clock signal and a reference clock signal and to acquire additional data indicating phase differences between said feedback clock signal and said reference clock signal, and
    wherein said processor is further adapted to access said additional data and to measure phase jitter between said reference clock signal and said feedback clock signal based on said additional data.

10. The circuit of claim 7, further comprising:
    a first multiplexer configured to selectively connect said delay locked loop and said Vernier delay line to one of a reference clock signal, said feedback clock signal, and said clock signal;
    a second multiplexer configured to selectively connect said Vernier delay line to one of said reference clock signal, said feedback clock signal and said delayed clock signal; and
    a controller electrically connected to said phase locked loop, said delay locked loop, said Vernier delay line, said first multiplexer and said second multiplexer and configured to coordinate a process flow of said circuit.

* * * * *